United States Patent
Xu et al.

(10) Patent No.: US 11,515,200 B2
(45) Date of Patent: Nov. 29, 2022

(54) SELECTIVE TUNGSTEN DEPOSITION WITHIN TRENCH STRUCTURES

(71) Applicant: Applied Materials, Inc., Santa Clara, CA (US)

(72) Inventors: Yi Xu, San Jose, CA (US); Yufei Hu, Fremont, CA (US); He Ren, San Jose, CA (US); Yu Lei, Belmont, CA (US); Shi You, San Jose, CA (US); Kazuya Daito, Milipitas, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 83 days.

(21) Appl. No.: 17/110,826

(22) Filed: Dec. 3, 2020

(65) Prior Publication Data
US 2022/0181201 A1    Jun. 9, 2022

(51) Int. Cl.
*H01L 21/768*    (2006.01)

(52) U.S. Cl.
CPC .. *H01L 21/76802* (2013.01); *H01L 21/76834* (2013.01); *H01L 21/76879* (2013.01)

(58) Field of Classification Search
CPC ......... H01L 21/76802; H01L 21/76834; H01L 21/7687
See application file for complete search history.

(56) References Cited

U.S. PATENT DOCUMENTS

| | | | |
|---|---|---|---|
| 9,806,018 B1 * | 10/2017 | Clevenger | H01L 21/76814 |
| 2017/0148670 A1 * | 5/2017 | Lei | C23C 16/0281 |
| 2017/0221758 A1 * | 8/2017 | Lin | H01L 21/76802 |
| 2018/0308694 A1 * | 10/2018 | Chen | H01L 21/285 |
| 2020/0066645 A1 | 2/2020 | Farmer et al. | |
| 2020/0091011 A1 * | 3/2020 | Khaderbad | H01L 27/0924 |
| 2020/0135858 A1 * | 4/2020 | Chiu | H01L 29/785 |
| 2020/0176574 A1 * | 6/2020 | Huang | H01L 21/76879 |
| 2020/0303250 A1 | 9/2020 | Cen et al. | |
| 2021/0193511 A1 * | 6/2021 | Wang | H01L 21/30604 |

OTHER PUBLICATIONS

Chang, Kow-Ming, et al., "Amorphouslike chemical vapor deposited tungsten diffusion barrier for copper metallization and effects of nitrogen addition", Journal of Applied Physics 82, 1469 (1997), 4 pages.

* cited by examiner

*Primary Examiner* — Karen Kusumakar
(74) *Attorney, Agent, or Firm* — Servilla Whitney LLC

(57) ABSTRACT

Embodiments of the disclosure provide methods which reduce or eliminate lateral growth of a selective tungsten layer. Further embodiments provide an integrated clean and deposition method which improves the selectivity of selectively deposited tungsten on trench structures. Additional embodiments provide methods for forming a more uniform and selective bottom-up gap fill for trench structures with improved film properties.

20 Claims, 4 Drawing Sheets

SELECTIVE TUNGSTEN DEPOSITION WITHIN TRENCH STRUCTURES

TECHNICAL FIELD

Embodiments of the disclosure generally relate to methods for selective deposition of tungsten within trench structures. In particular, some embodiments of the disclosure relate to methods which integrate cleaning and deposition processes for improved film properties.

BACKGROUND

Integrated cleaning and selective tungsten deposition processes have been used in multiple semiconductor applications. These methods enable the production of liner-free, seam-free via fill for contacts. Yet, trenches typically have a larger bottom surface area than those of vias. This larger deposition area can make it difficult to grow uniform films in the trench. Accordingly, the same methods, when applied to trench structures, often fail to provide suitable deposition selectivity and film properties (e.g., roughness, thickness, uniformity).

Accordingly, there is a need for improved methods for selective tungsten deposition within trench structures with superior film properties.

SUMMARY

One or more embodiments of the disclosure are directed to a deposition method comprising recessing a line of a metal material to form a trench having a bottom surface and two sidewalls. The trench has a depth to the bottom surface comprising the metal material and a width between the two sidewalls comprising a dielectric. A tungsten film is selectively deposited on the recessed metal material and laterally bounded by the two sidewalls.

Additional embodiments of the disclosure are directed to a selective deposition method comprising exposing a trench having a bottom surface comprising a metal material and two sidewalls comprising a dielectric to a plurality of chemical exposures to clean the surfaces of the metal material and the dielectric. A tungsten film is selectively deposited on the cleaned surface of the metal material.

Further embodiments of the disclosure are directed to a deposition method comprising recessing a line of a metal material to form a trench having a bottom surface and two sidewalls. The trench has a depth to the bottom surface comprising the metal material and a width between the two sidewalls comprising a dielectric. The trench is exposed to a plurality of chemical exposures to clean the surfaces of the metal material and the dielectric. A tungsten film is selectively deposited on the cleaned surface of the metal material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiment of the disclosure advantageously provides methods for eliminating the lateral growth of selectively deposited tungsten. Some embodiments of the disclosure recess a line of metal material to form a trench and selectively deposit tungsten on the recessed metal line and bounded by the trench sidewalls.

Figure 1:
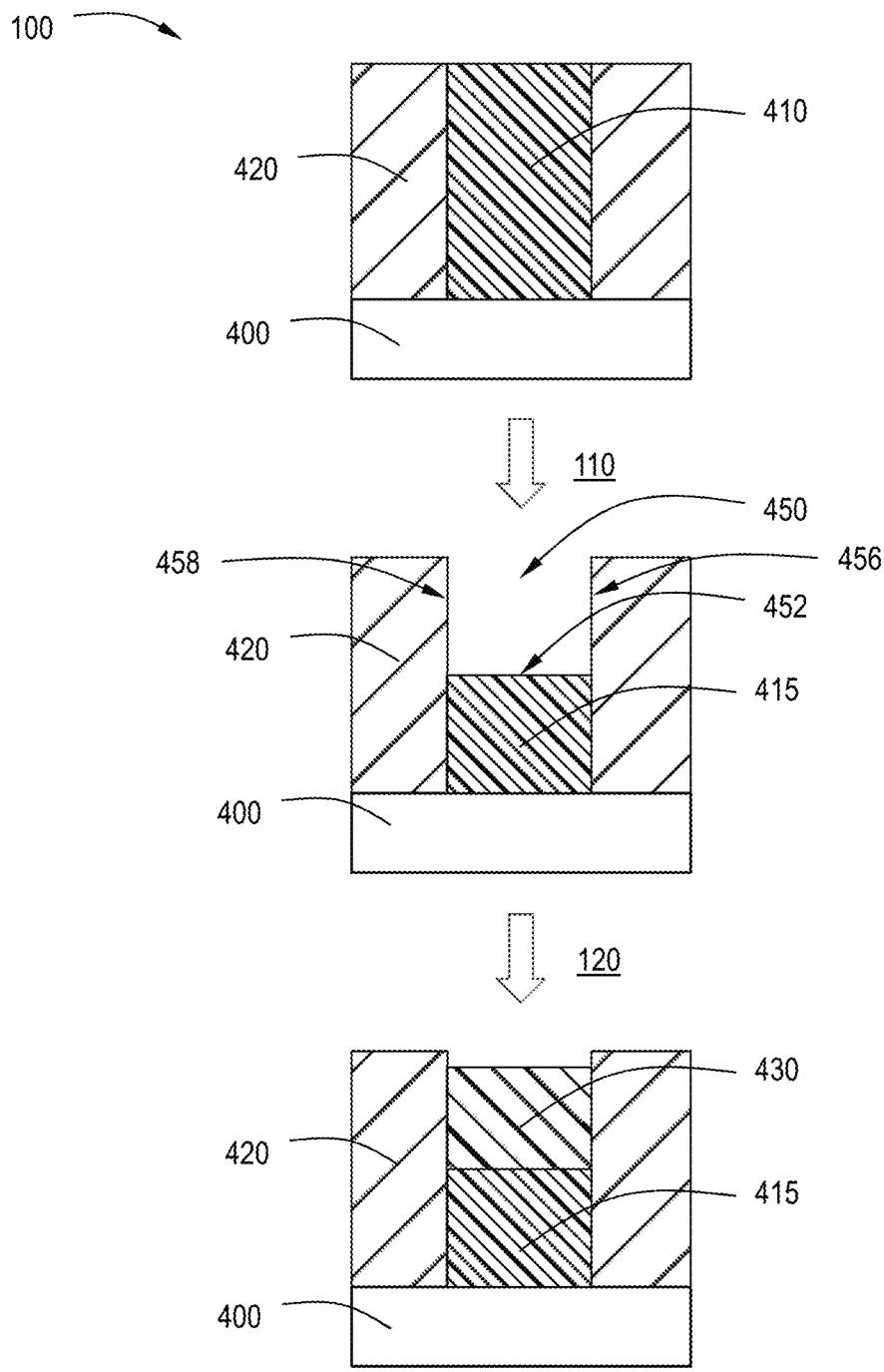
FIG. 1 is a cross sectional view of a substrate during processing according to one or more embodiment of the disclosure.

Referring to FIG. 1, a method 100 is shown for processing an exemplary substrate 400. The substrate 400 comprises at least one line of a metal material 410 bounded by a dielectric 420.

In some embodiments, the metal material 410 comprises one or more of copper, cobalt, tungsten, molybdenum or ruthenium. In some embodiments, the metal material 410 consists essentially of cobalt. In some embodiments, the metal material 410 consists essentially of tungsten. In some embodiments, the metal material 410 consists essentially of ruthenium. In some embodiments, the metal material 410 consists essentially of molybdenum. As used in this regard, a metal material which "consists essentially of" a stated element comprises greater than or equal to 95%, greater than or equal to 98%, greater than or equal to 99% or greater than or equal to 99.5% of the stated element on an atomic basis.

In some embodiments, the dielectric 420 comprises silicon oxide, silicon nitride or combinations thereof. In some embodiments, the dielectric consists essentially of silicon oxide. It is noted that the foregoing descriptors (e.g., silicon oxide) should not be interpreted to disclose any particular stoichiometric ratio. Accordingly, "silicon oxide" and the like will be understood by one skilled in the art as a material consisting essentially of silicon and oxygen without disclosing any specific stoichiometric ratio.

At 110, the metal material 410 is recessed to form a trench 450 having a bottom surface 452 comprising the recessed metal material 415 and two sidewalls 456, 458 comprising the dielectric 420. The trench 450 has a depth D to the bottom surface 452 and a width W between the two sidewalls 456, 458. In some embodiments, the depth D is in a range of 2 nm to 200 nm, 3 nm to 200 nm, 5 nm to 100 nm, 2 nm to 100 nm, or 50 nm to 100 nm. In some embodiments, the width W is in a range of 10 nm to 100 nm, 10 nm to 20 nm, 10 nm to 50 nm, or 50 nm to 100 nm. In some embodiments, the trench 450 has an aspect ratio (D/W) in a range of 1 to 20, 5 to 20, 10 to 20, or 15 to 20.

In some embodiments, the metal material is recessed by a wet etch process. In some embodiments, the metal material is recessed by a dry etch process.

While not shown in the Figures, the trench 450 has a length L greater than the width W. In some embodiments, the ratio between length L and width W is greater than or equal to 2, greater than or equal to 5, greater than or equal to 10, greater than or equal to 20, greater than or equal to 50, greater than or equal to 100, or greater than or equal to 500. In some embodiments, the length L of the trench 450 is bounded by vertical walls. In some embodiments, the length L of the trench 450 is bounded only by the edge of the substrate 400.

Next, at 120, a tungsten film 430 is selectively deposited on the recessed metal material 415. In some embodiments, the tungsten film 430 is laterally bounded by the two sidewalls 456, 458 of the trench 450. As used in this regard, "laterally bounded" means that the deposited material does not extend beyond the point of intersection between the top surface and the two sidewalls. In some embodiments, the tungsten film 430 extends above the trench 450. In some embodiments, as shown in FIG. 1, the tungsten film is entirely within the trench 450. As used in this regard, a material which "entirely within" a trench does not extend above the trench and is laterally bounded by the two sidewalls 456, 458 of the trench 450.

In some embodiments, selectively depositing the tungsten film comprises exposing the trench 450 to a tungsten precursor and a reductant. In some embodiments, the tungsten precursor comprises $WF_6$. In some embodiments, the reductant comprises one or more of $H_2$, silane ($SiH_4$) or diborane ($B_2H_6$).

In some embodiments, the temperature of the substrate is maintained at a temperature less than or equal to 350° C. In some embodiments, the pressure of the processing chamber is maintained at a pressure less than or equal to 30 Torr.

In some embodiments, the processes of method 100 are each performed within the same processing chamber. In some embodiments, the processes of method 100 are each performed within a different processing chamber. In some embodiments, the different processing chambers are connected as part of a processing system. In some embodiments, the processes of method 100 are performed without an intervening vacuum break.

Figure 2:
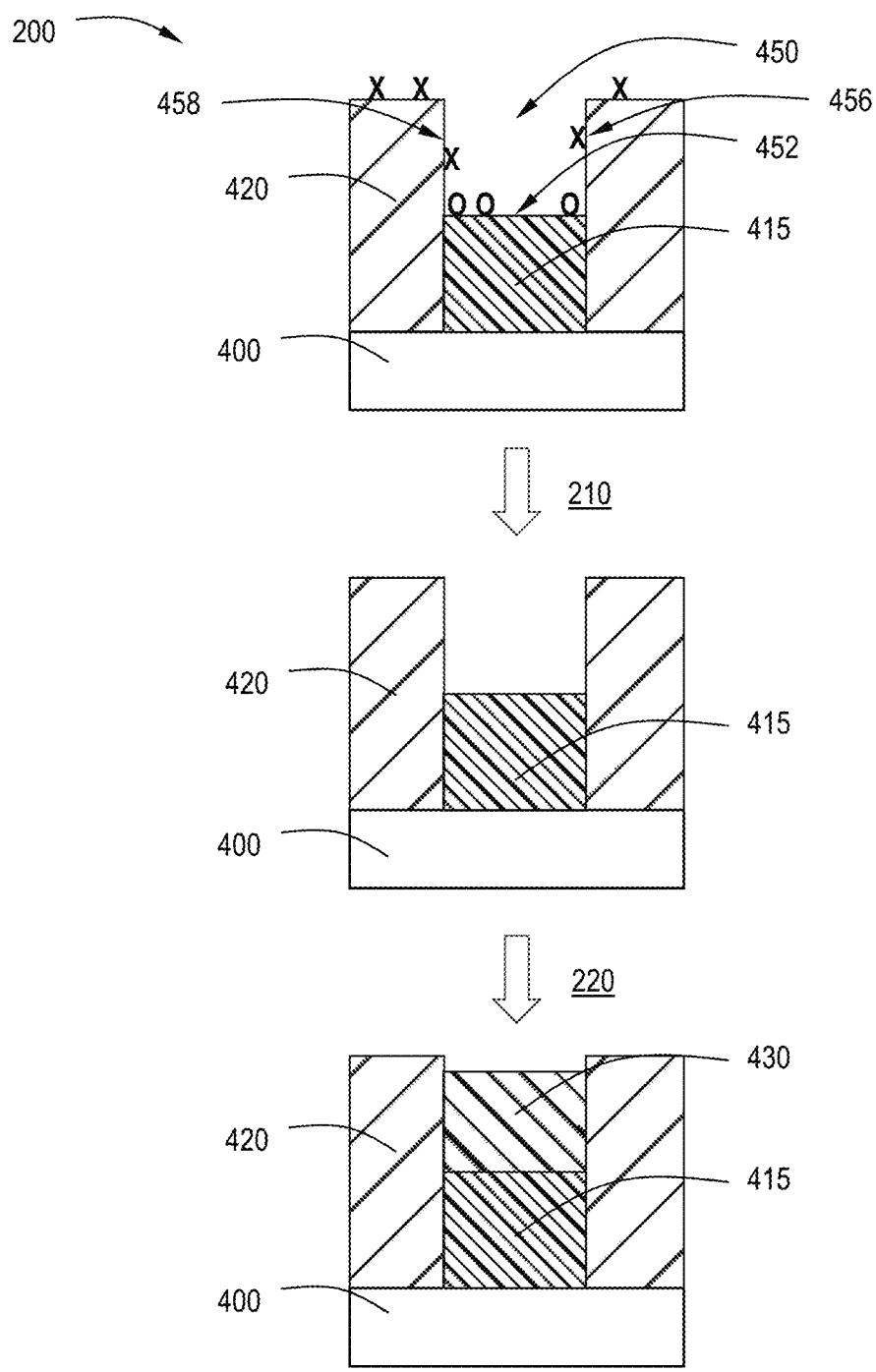
FIG. 2 is a cross sectional view of a substrate during processing according to one or more embodiment of the disclosure.

Referring to FIG. 2, a method 200 is shown for processing an exemplary substrate 400. The substrate 400 comprises at least one trench 450 having a bottom surface 452 comprising a recessed metal material 415 and two sidewalls 456, 458 comprising a dielectric 420.

The surfaces of the recessed metal material 415 and the dielectric 420 comprise contaminants, shown as O and X, respectively, in FIG. 2. In some embodiments, the contaminants may include, but are not limited to, one or more of organic compounds, polymeric compounds, metal oxides or metal nitrides. In some embodiments, the contaminants are created on the surfaces of the recessed metal material 415 and the dielectric 420 by the process which recesses the metal material 415.

While the materials of the recessed metal material 415 and the dielectric 420 are the same as those identified above with respect to method 100, the method 200 is not limited by the process steps of method 100. Stated differently, the recessed metal material 415 referred to in describing method 200 may be formed by any suitable method.

At 210, the trench 450 is exposed to a plurality of chemical exposures to clean the surface of the recessed metal material 415 and the dielectric 420. In some embodiments, at least one of the plurality of chemical exposures comprises a plasma exposure. In some embodiments, the plasma is an inductively coupled plasma (ICP). In some embodiments, the plasma is a capacitively coupled plasma (CCP). In some embodiments, the plasma is generated remotely. In some embodiments, the plasma is generated within the processing chamber (direct plasma).

In some embodiments, at least one of the plurality of chemical exposures comprises a thermal soak. A thermal soak will be understood by one skilled in the art to comprise exposing the trench to a chemical agent without the use of plasma or other radicals.

In some embodiments, the plurality of chemical exposures comprises exposure to one or more of Ar, $H_2$, $O_2$, or $WF_6$. In some embodiments, the plurality of chemical exposures comprises Ar and $H_2$. In some embodiments, the plurality of chemical exposures comprises Ar and $O_2$. In some embodiments, the plurality of chemical exposures comprises $H_2$ and $O_2$. In some embodiments, the plurality of chemical exposures comprises $WF_6$, $H_2$, and $WF_6$.

In some embodiments, the temperature of the substrate is controlled during the plurality of chemical exposures. In some embodiments, the temperature is maintained in a range of 20° C. to 400° C., in a range of 20° C. to 350° C., in a range of 20° C. to 300° C., in a range of 20° C. to 250° C., in a range of 20° C. to 200° C., in a range of 20° C. to 150° C., in a range of 20° C. to 100° C., in a range of 100° C. to 400° C., in a range of 200° C. to 400° C., or in a range of 300° C. to 400° C.

At 220, a tungsten film 430 is selectively deposited on the cleaned surface of the recessed metal material 415. In some embodiments, the tungsten film 430 is laterally bounded by the two sidewalls 456, 458 of the trench 450. As used in this regard, "laterally bounded" means that the deposited material does not extend beyond the point of intersection between the top surface and the two sidewalls. In some embodiments, the tungsten film 430 extends above the trench 450. In some embodiments, as shown in FIG. 2, the tungsten film is entirely within the trench 450. As used in this regard, a material which is "entirely within" a trench does not extend above the trench and is laterally bounded by the two sidewalls 456, 458 of the trench 450.

The methods and materials for selectively depositing the tungsten film 430 are described above with respect to method 100.

Without being bound by theory, it is believed that the plurality of chemical exposures improves the quality of the deposited tungsten film 430. In some embodiments, the tungsten film 430 deposited by the methods of the disclosure demonstrate one or more of increased selectivity, decreased surface roughness, and/or decreased grain size.

In some embodiments, the tungsten film 230 is selectively deposited with a selectivity at least 20 times greater, at least 50 times greater, at least 100 times greater, at least 200 times greater, at least 500 times greater, at least 1,000 times greater, at least 2,000 times greater or at least 5,000 times greater than a similar process performed without the plurality of chemical exposures.

In some embodiments, the tungsten film 230 has a roughness of less than or equal to 1 nm when tungsten film 230 has a thickness of 10 nm. In some embodiments, the tungsten film 230 has a grain size of less than or equal to 10 nm.

In some embodiments, the processes of method 200 are each performed within the same processing chamber. In some embodiments, the processes of method 200 are each performed within a different processing chamber. In some embodiments, the different processing chambers are connected as part of a processing system. In some embodiments, the processes of method 200 are performed without an intervening vacuum break.

Figure 3:
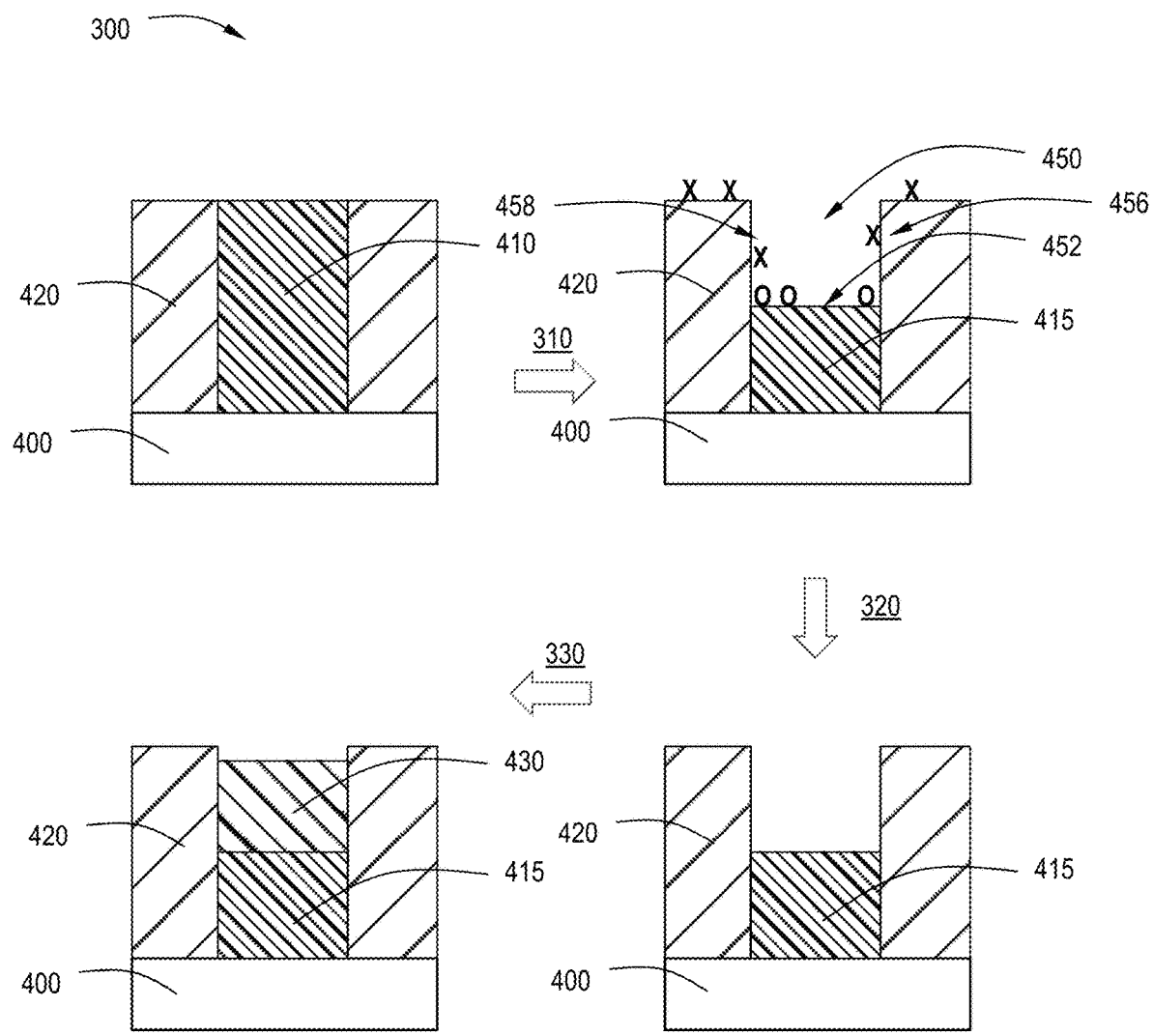
FIG. 3 is a cross sectional view of a substrate during processing according to one or more embodiment of the disclosure.

Referring to FIG. 3, a method 300 is shown for processing an exemplary substrate 400. The substrate 400 comprises at least one line of a metal material 410 bounded by a dielectric 420.

At 310, the metal material 410 is recessed to form a trench 450 having a bottom surface 452 comprising the recessed metal material 415 and two sidewalls 456, 458 comprising the dielectric 420. The method performed at 310 is similar to the method performed at 110.

In some embodiments, the process of recessing the metal material 410 produces contaminants on the surface of the recessed metal material 415 and/or the dielectric 420. In FIG. 3, the contaminants are shown as O and X, respectively.

At 320, the trench 450 is exposed to a plurality of chemical exposures to clean the surface of the recessed metal material 415 and the dielectric 420. The method performed at 320 is similar to the method performed at 210.

At 330, a tungsten film 430 is selectively deposited on the cleaned surface of the recessed metal material 415. In some embodiments, the tungsten film 430 is laterally bounded by the two sidewalls 456, 458 of the trench 450. In some embodiments, the tungsten film 430 extends above the trench 450. In some embodiments, as shown in FIG. 2, the tungsten film is entirely within the trench 450. In some embodiments, the tungsten film 430 fills the trench 450. As used in this regard, a film which "fills the trench" has a volume which occupies at least 95%, at least 98%, or at least 99% of the volume of the trench.

The methods and materials for selectively depositing the tungsten film 430 are described above with respect to method 100. The properties of the deposited tungsten film 430 are described above with respect to method 200.

In some embodiments, the processes of method 300 are each performed within the same processing chamber. In some embodiments, the processes of method 300 are each performed within a different processing chamber. In some embodiments, the different processing chambers are connected as part of a processing system. In some embodiments, the processes of method 300 are performed without an intervening vacuum break.

Figure 4:
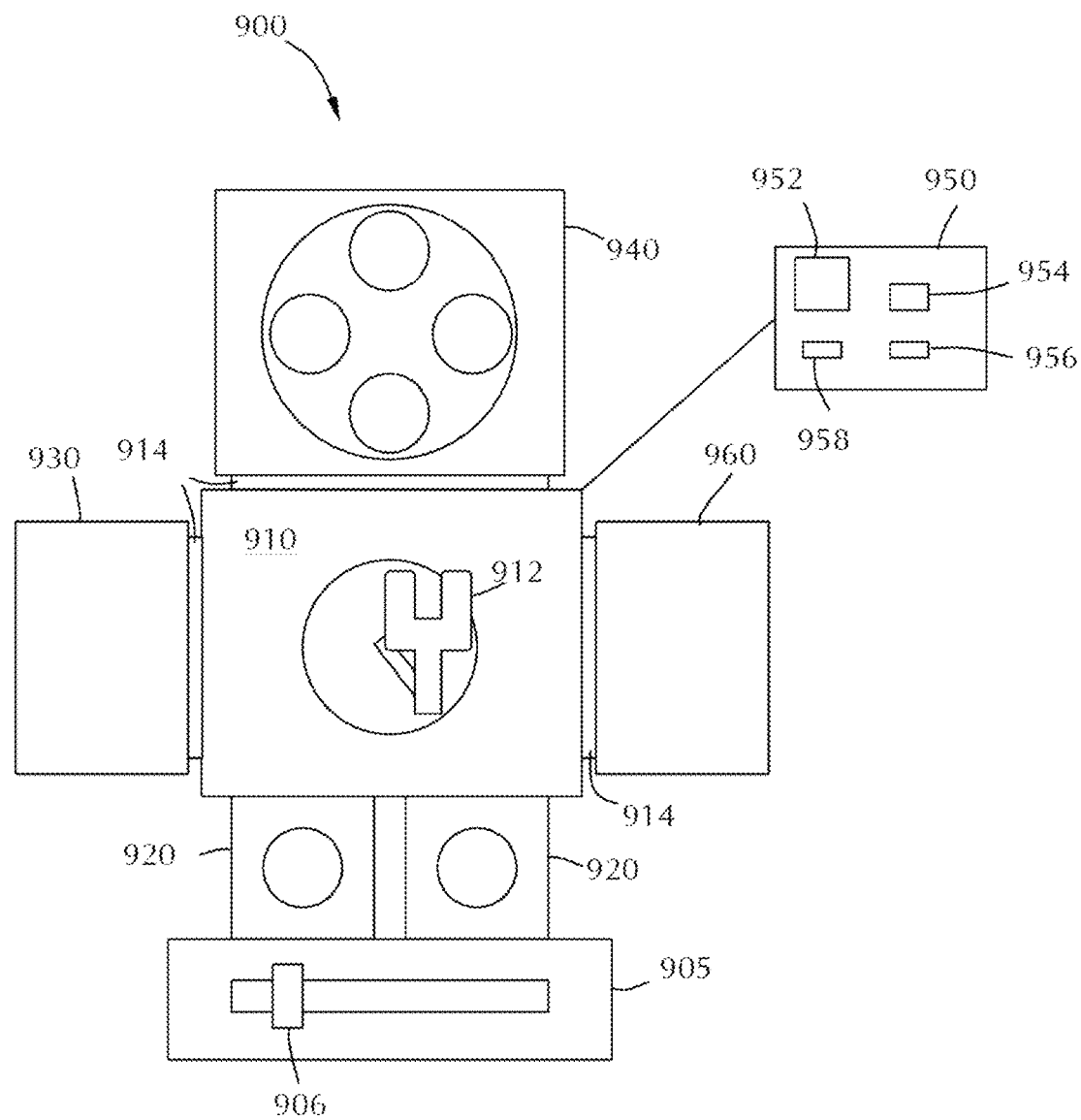
FIG. 4 is a schematic view of a processing system according to one or more embodiment of the disclosure.

Referring to FIG. 4, additional embodiments of the disclosure are directed to a processing system 900 for executing the methods described herein. FIG. 4 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean/buffer chamber 920 is connected to the central transfer station 910. The pre-clean/buffer chamber 920 can include one or more of a heater, a radical source or plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, there are two pre-clean/buffer chambers 920 connected to the central transfer station 910.

In the embodiment shown in FIG. 4, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900.

A first processing chamber 930 can be connected to the central transfer station 910. The first processing chamber 930 can be configured as an etching chamber and may be in fluid communication with one or more reactive gas sources to provide one or more flows of reactive gases to the first processing chamber 930. The substrate can be moved to and from the processing chamber 930 by the robot 912 passing through isolation valve 914.

Processing chamber 940 can also be connected to the central transfer station 910. In some embodiments, processing chamber 940 comprises a cleaning chamber and is fluid communication with one or more reactive gas sources to provide flows of reactive gas to the processing chamber 940 to perform the cleaning process. The substrate can be moved to and from the processing chamber 940 by robot 912 passing through isolation valve 914.

In some embodiments, processing chamber 960 is connected to the central transfer station 910. In some embodiments, processing chamber 960 comprises a selective deposition chamber and is fluid communication with one or more reactive gas sources to provide flows of reactive gas to the processing chamber 960 to perform the deposition process. The substrate can be moved to and from the processing chamber 960 by robot 912 passing through isolation valve 914.

In some embodiments, each of the processing chambers 930, 940, and 960 are configured to perform different portions of the processing method. For example, processing chamber 930 may be configured to perform the etch process, processing chamber 940 may be configured to perform the cleaning process, and processing chamber 960 may be configured to perform a selective deposition process. The skilled artisan will recognize that the number and arrangement of individual processing chamber on the tool can be varied and that the embodiment illustrated in FIG. 4 is merely representative of one possible configuration.

In some embodiments, the processing system 900 includes one or more metrology stations. For example metrology stations can be located within pre-clean/buffer chamber 920, within the central transfer station 910 or within any of the individual processing chambers. The metrology station can be any position within the system 900 that allows the distance of the recess to be measured without exposing the substrate to an oxidizing environment.

At least one controller 950 is coupled to one or more of the central transfer station 910, the pre-clean/buffer chamber 920, processing chambers 930, 940, or 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and subprocessors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 950 has one or more configurations to execute individual processes or sub-processes to perform the method. The controller 950 can be connected to and configured to operate intermediate components to perform the functions of the methods. For example, the controller 950 can be connected to and configured to control one or more of gas valves, actuators, motors, slit valves, vacuum control, etc.

The controller 950 of some embodiments has one or more configurations selected from: a configuration to move a substrate on the robot between the plurality of processing chambers and metrology station; a configuration to load and/or unload substrates from the system; a configuration to recess the metal material; a configuration to clean the surface of the recessed metal material and the dielectric; and a configuration to selectively deposit tungsten.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A deposition method comprising:
recessing a line of a metal material to form a trench having a bottom surface and two sidewalls, the trench having a depth to the bottom surface consisting essentially of the metal material and a width between the two sidewalls comprising a dielectric; and
selectively depositing a tungsten film on the recessed metal material and laterally bounded by the two sidewalls.

2. The method of claim 1, wherein the metal material comprises one or more of copper, cobalt, tungsten or ruthenium.

3. The method of claim 1, wherein the dielectric comprises silicon oxide, silicon nitride or combinations thereof.

4. The method of claim 1, wherein the line of the metal material is recessed by a wet etch process.

5. The method of claim 1, wherein the line of the metal material is recessed by a dry etch process.

6. The method of claim 1, wherein the trench has a depth in a range of 3 nm to 200 nm.

7. The method of claim 6, wherein the trench has an aspect ratio in a range of 1:1 to 20:1.

8. The method of claim 1, wherein selectively depositing the tungsten film comprises exposing the trench to $WF_6$ and $H_2$.

9. A selective deposition method comprising:
exposing a trench having a bottom surface consisting essentially of a metal material and two sidewalls comprising a dielectric to a plurality of chemical exposures to clean the surfaces of the metal material and the dielectric; and
selectively depositing a tungsten film on the cleaned surface of the metal material.

10. The method of claim 9, wherein the plurality of chemical exposures comprises a plasma exposure.

11. The method of claim 10, wherein the plurality of chemical exposures consists of a $H_2$ plasma exposure and an $O_2$ plasma exposure.

12. The method of claim 9, wherein the plurality of chemical exposures comprises a thermal soak.

13. The method of claim 9, wherein the plurality of chemical exposures comprises exposure to Ar, $H_2$, $O_2$ or $WF_6$.

14. The method of claim 9, wherein the plurality of chemical exposures are performed at a temperature in a range of 20° C. to 400° C.

15. The method of claim 9, wherein the tungsten film is deposited with a selectivity at least 1000 times greater than a similar process performed without the plurality of chemical exposures.

16. The method of claim 9, wherein the tungsten film has a roughness of less than or equal to 1 nm.

17. The method of claim 8, wherein the tungsten film has a grain size of less than or equal to 10 nm.

18. A deposition method comprising:
recessing a line of a metal material to form a trench having a bottom surface and two sidewalls, the trench having a depth to the bottom surface consisting essentially of the metal material and a width between the two sidewalls comprising a dielectric;
exposing the trench to a plurality of chemical exposures to clean the surfaces of the metal material and the dielectric; and
selectively depositing a tungsten film on the cleaned surface of the metal material.

19. The method of claim 18, wherein the tungsten film is deposited entirely within the trench.

20. The method of claim 18, wherein the tungsten film fills the trench.

* * * * *